United States Patent
McColloch

(10) Patent No.: US 7,190,706 B2
(45) Date of Patent: Mar. 13, 2007

(54) SOFT METAL HEAT TRANSFER FOR TRANSCEIVERS

(75) Inventor: Laurence Ray McColloch, Santa Clara, CA (US)

(73) Assignee: Avago Technologies Fiber IP (Singapore) Ptd. Ltd., Singapore (SG)

( * ) Notice: Subject to any disclaimer, the term of this patent is extended or adjusted under 35 U.S.C. 154(b) by 451 days.

(21) Appl. No.: 10/732,994

(22) Filed: Dec. 10, 2003

(65) Prior Publication Data

US 2005/0129074 A1     Jun. 16, 2005

(51) Int. Cl.
*H01S 3/04* (2006.01)

(52) U.S. Cl. .................. 372/34; 372/35; 372/36; 372/38.02; 372/53

(58) Field of Classification Search ........... 372/34–36, 372/53, 38.02; 257/712–719; 438/122
See application file for complete search history.

(56) References Cited

U.S. PATENT DOCUMENTS

| | | | | |
|---|---|---|---|---|
| 5,247,528 A | * | 9/1993 | Shinozaki et al. | 372/22 |
| 5,796,582 A | * | 8/1998 | Katchmar | 361/704 |
| 6,278,182 B1 | * | 8/2001 | Liu et al. | 257/712 |
| 6,282,096 B1 | * | 8/2001 | Lo et al. | 361/704 |
| 6,392,890 B1 | * | 5/2002 | Katchmar | 361/705 |
| 6,407,461 B1 | * | 6/2002 | Farquhar et al. | 257/787 |
| 6,603,183 B1 | * | 8/2003 | Hoffman | 257/434 |
| 6,653,741 B2 | * | 11/2003 | Sreeram et al. | 257/781 |
| 6,654,248 B1 | * | 11/2003 | Fishley et al. | 361/704 |
| 6,812,548 B2 | * | 11/2004 | Dias et al. | 257/620 |
| 6,891,259 B2 | * | 5/2005 | Im et al. | 257/687 |
| 2002/0185748 A1 | * | 12/2002 | Akram et al. | 257/778 |
| 2003/0085475 A1 | * | 5/2003 | Im et al. | 257/796 |
| 2003/0183909 A1 | * | 10/2003 | Chiu | 257/667 |
| 2004/0022487 A1 | * | 2/2004 | Nagasaka et al. | 385/31 |

\* cited by examiner

*Primary Examiner*—Minsun Oh Harvey
*Assistant Examiner*—Delma R. Flores-Ruiz

(57) ABSTRACT

A laser package includes a submount, a laser die mounted on the submount, a lid mounted on the submount over the laser die, and a soft metal disposed between the laser die and the lid, wherein the soft metal conducts heat between the laser die and the lid. The soft metal is able to creep or cold flow under pressure to accommodate for varying manufacturing tolerances and varying thermal expansion rates of the elements in the laser package.

18 Claims, 3 Drawing Sheets

SOFT METAL HEAT TRANSFER FOR TRANSCEIVERS

FIELD OF INVENTION

This invention relates to heat dissipation for laser transmitters, receivers, and transceivers.

DESCRIPTION OF RELATED ART

The performance and life of a laser are often affected by temperature. Some devices, such as lasers in dense wavelength division multiplexers (DWDM) or lasers with external electro-absorption modulators, require fine temperature control often within 1 degree Celsius. The heat generated by a laser must be dissipated away from the laser.

A semiconductor laser, such as an edge-emitting laser or a vertical cavity surface-emitting laser (VCSEL), generates a large amount of heat in a small area (i.e., high heat density). Thus, the conduction path away from the laser must be able to transfer the heat away at high density.

In additional to a low resistance thermal path, a semiconductor laser also requires short electrical connections (i.e., low inductance and capacitance connections) and very accurate alignment of the optical components. Flip chip assembly is often considered for short and high performance electrical connection. Flip chip connections, such as solder balls, can also be self-aligning using the surface tension of the solder.

However, flip chip mounting of a laser die has poor heat transfer characteristics. The contact area of the solder ball joint is very small and thus thermally resistive. Therefore, another heat path must be added to dissipate heat away from the laser. The back of the laser die is usually used as a path for beat transfer. However, the exact location of the laser and the thickness of the laser die have manufacturing variations that create a variation in the location of the back of the laser die. A conventional solid connection between the back of the laser die and a heat sink often creates an over-constrained design that overstresses and breaks the solder ball joints. Non-rigid connections, such as crushable gold wire mesh, carbon or metal loaded elastomer pads, and spring contacts, usually have poor heat transfer characteristics. Thermal and electrical connections must survive large temperature variations, such as those that occur when the finished package is soldered to a printed circuit board (PCB). These temperature variations can often be the stress that breaks connections in over-constrained designs.

Thus, what is needed is a laser package with a thermal connection that provides high heat transfer away from the laser for a large temperature variation while remaining adaptable to varying manufacturing tolerance.

SUMMARY

In one embodiment of the invention, a laser package includes a submount, a laser die mounted on the submount, a lid mounted on the submount over the laser die, and a soft metal disposed between the laser die and the lid, wherein the soft metal conducts heat between the laser die and the lid. In one embodiment, the soft metal is able to creep or cold flow under pressure to accommodate for varying manufacturing tolerances and varying thermal expansion rates of the elements in the laser package.

DETAILED DESCRIPTION

Figure 1:
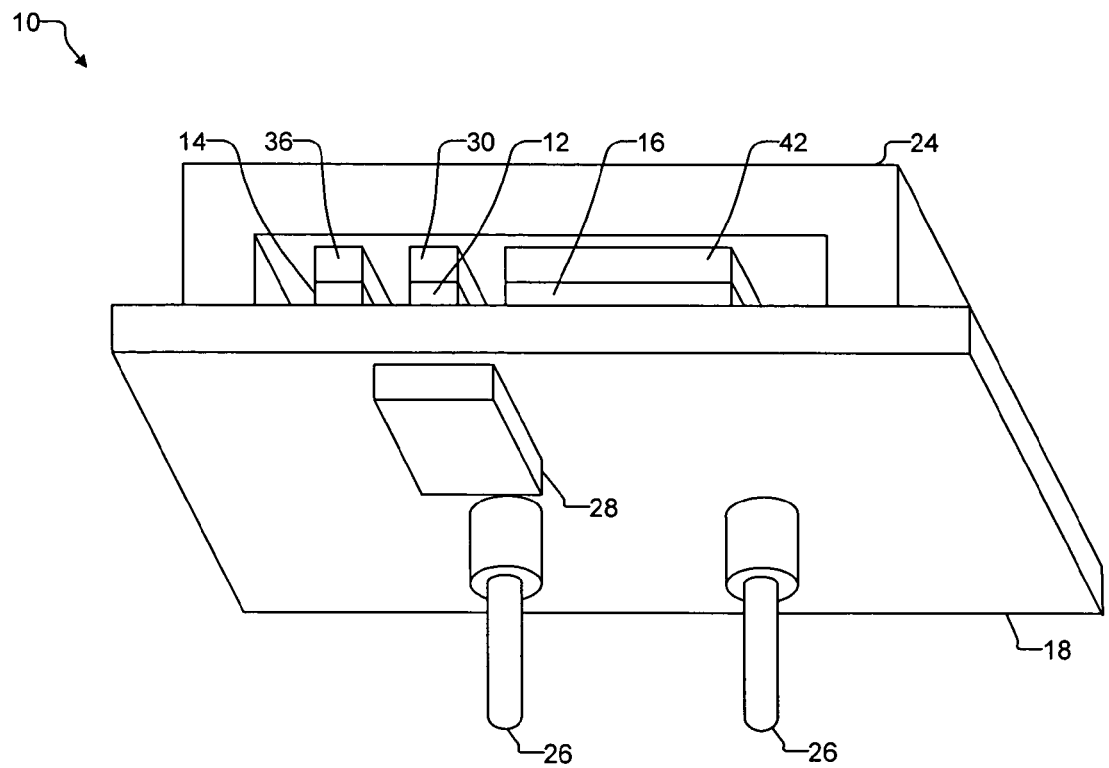
FIGS. 1 and 2 illustrate perspective and side views of a laser package in one embodiment of the invention.
Figure 2:
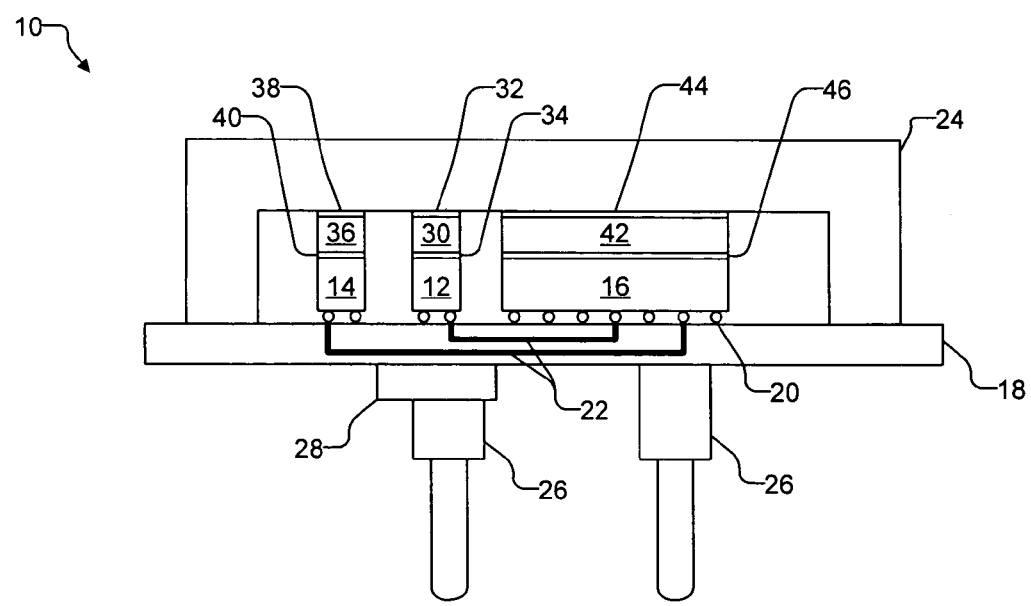

FIGS. 1 and 2 illustrate perspective and side views of a laser package 10 in one embodiment of the invention. Package 10 may be part of a laser transmitter, receiver, or transceiver.

Package 10 includes a laser die 12, a photodetector die 14, and a laser driver die 16 mounted on the top surface of a submount 18. In one embodiment, dies 12, 14, and 16 are flip chip mounted by solder balls 20 on their top surface onto submount 18. For clarity, only one solder ball 20 has been labeled in FIG. 2.

Laser die 12 includes one laser or an array of lasers, such as edge-emitting lasers or VCSELs. Photodetector die 14 includes one feedback photodetector or an array of feedback photodetectors, such as positive-intrinsic-negative (PIN) photodiodes. Laser driver die 16 includes integrated circuits (ICs) that drive laser die 12 and process the feedback signals from photodetector die 14. Laser driver die 16 can include additional ICs depending on the application. Although shown as discrete components, dies 12, 14, and 16 can be integrated into a single die.

Submount 18 includes interconnects 22 that couple dies 12, 14, and 16. For clarity, only two interconnects 22 have been labeled in FIG. 2. Submount 18 can include additional ICs depending on the application. A lid 24 is mounted on the top surface of submount 18 to at least partially enclose dies 12, 14, and 16. In one embodiment, lid 24 hermetically seals dies 12, 14, and 16. In one embodiment, lid 24 is silicon.

Alignment pins 26 are mounted on the back surface of submount 18. Alignment pins 26 align package 10 to a connector containing optical fibers. A lens 28 is mounted on the back surface of submount 18 opposite of laser die 12. Lens 28 focuses light emitted by laser die 12 into the optical fibers. Although shown as a discrete component, lens 28 can be integrated into submount 18.

A soft metal thermal conductor 30 is disposed between the inner surface of lid 24 and the bottom surface of flip chip mounted laser die 12. Soft metal 30 can creep or cold flow. A soft metal, such as indium, can cold flow at a pressure of 500 pounds per square inch. A soft metal, again such as indium, can cold flow much faster than package 10 (specifically laser die 12 and lid 24) can thermally cycle (i.e., expand and contract). Soft metal 30 can be indium, gallium, mercury, or tin/lead solder Soft metal 30 may be liquid or solid depending on the temperatures of laser die 12 and lid 24. The inner surface of lid 24 and the bottom surface of laser die 12 have corresponding metal pads 32 and 34 (FIG. 2 only) that control the location of the soft metal by not letting soft metal 30 flow out of the joint. The soft or liquid metal 30 is held in place by surface tension. The design of pads 32 and 34 are such that these pads do not dissolve into soft metal 30.

Similar to soft metal 30, a soft metal thermal conductor 36 can be disposed between the inner surface of lid 24 and the bottom surface of flip chip mounted photodetector die 14. The inner surface of lid 24 and the bottom surface of photodetector die 14 have corresponding metal pads 38 and 40 (FIG. 2 only) that control the wetting of soft metal 36 when it is liquid.

Furthermore, a soft metal thermal conductor 42 can be disposed between the inner surface of lid 24 and the bottom surface of flip chip mounted laser driver die 16. The inner surface of lid 24 and the bottom surface of laser driver die 16 have corresponding metal pads 44 and 46 (FIG. 2 only) that control the wetting of soft metal 42 when it is in the liquid state.

In one embodiment where the soft metal is indium and the metal pads are gold, a gold-indium intermetallic is formed at their interface. The gold-indium intermetallic does not melt and maintains the connection under tension at temperatures when the indium is solid. Gold is particularly well suited as the material for the metal pads because it can be easily plated and the gold intermetallic at the surfaces resists melting even at high temperature. If the metal pads are made of another material, an over-constrained design may result when the innermatalic continues to diffuse through the whole joint and significantly stiffens the joint.

The soft metal thermal conductor yields or flows under a low force even when it is solid. Thus, the soft metal thermal conductor stays in constant contact between the lid and the dies when the soft metal is liquid or solid, thereby providing high heat transfer between the lid and the dies. Furthermore, the soft metal thermal conductor accommodates changes in the manufacturing tolerances and the small movement between parts caused by coefficient of thermal expansion (CTE) mismatch between the materials of package 10.

FIGS. 3, 4, 5, and 6 illustrate the assembly of laser package 10 in one embodiment of the invention.

Figure 3:
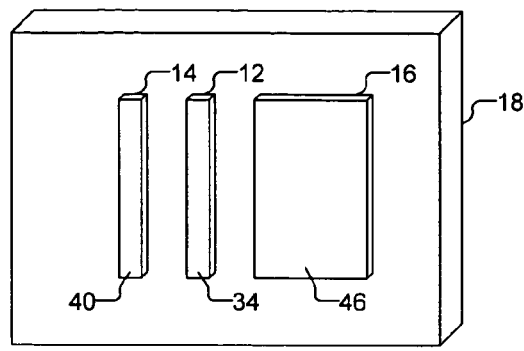
FIGS. 3, 4, 5, and 6 illustrate the assembly of a laser package in one embodiment of the invention.

In a first step shown in FIG. 3, laser die 12, photodetector die 14, and laser driver die 16 are flip chip mounted on solder balls onto substrate 18. Dies 14, 12 and 16 can have their backsides metallized at the wafer level to form metal pads 34, 40, and 46 before being sawn into individual dies.

Figure 4:
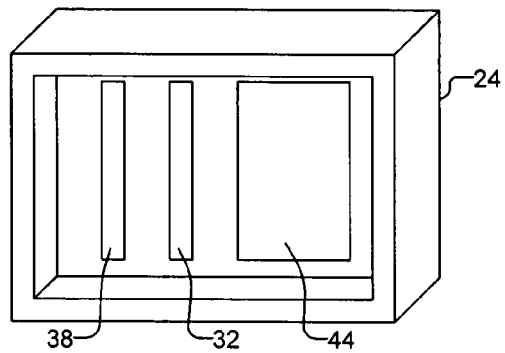

In a second step shown in FIG. 4, metal pads 32, 38, and 44 are formed on the inner surface of lid 24. In one embodiment, metal pads 32, 38, and 44 are formed by vacuum metallization.

Figure 5:
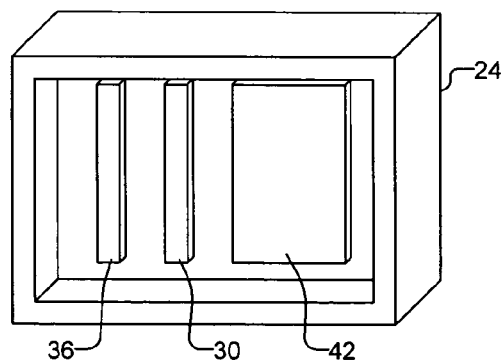

In a third step shown in FIG. 5, soft metals 30, 36; and 42 are disposed on metal pads 32, 38, and 44 of lid 24. Soft metals 30, 36, and 42 can be metal performs (stamped soft metal pieces) placed, or pressed, on metal pads 32, 38, and 44. Preforms 30, 36, and 42 can be loose or held in place by the slight force of interlocking when they are pressed down into metal pads 32, 38 and 44.

Figure 6:
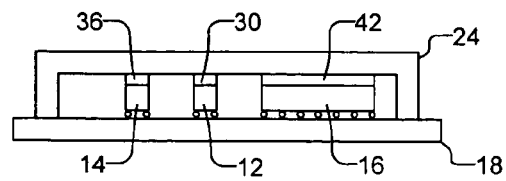

In a fourth step shown in FIG. 6, lid 24 is mounted on the top surface of submount 18 to at least partially enclose dies 12, 14, and 16. At the same time, soft metals 30, 36, and 42 are sandwiched between lid 24 and dies 12, 14, and 16. Note that the thickness of soft metals 30, 36, and 42 are selected to be greater than the gap between lid 24 and dies 12, 14, and 16. By making the preforms thicker than required for final assembly, they will cold flow to the correct thickness during assembly.

Figure 7:
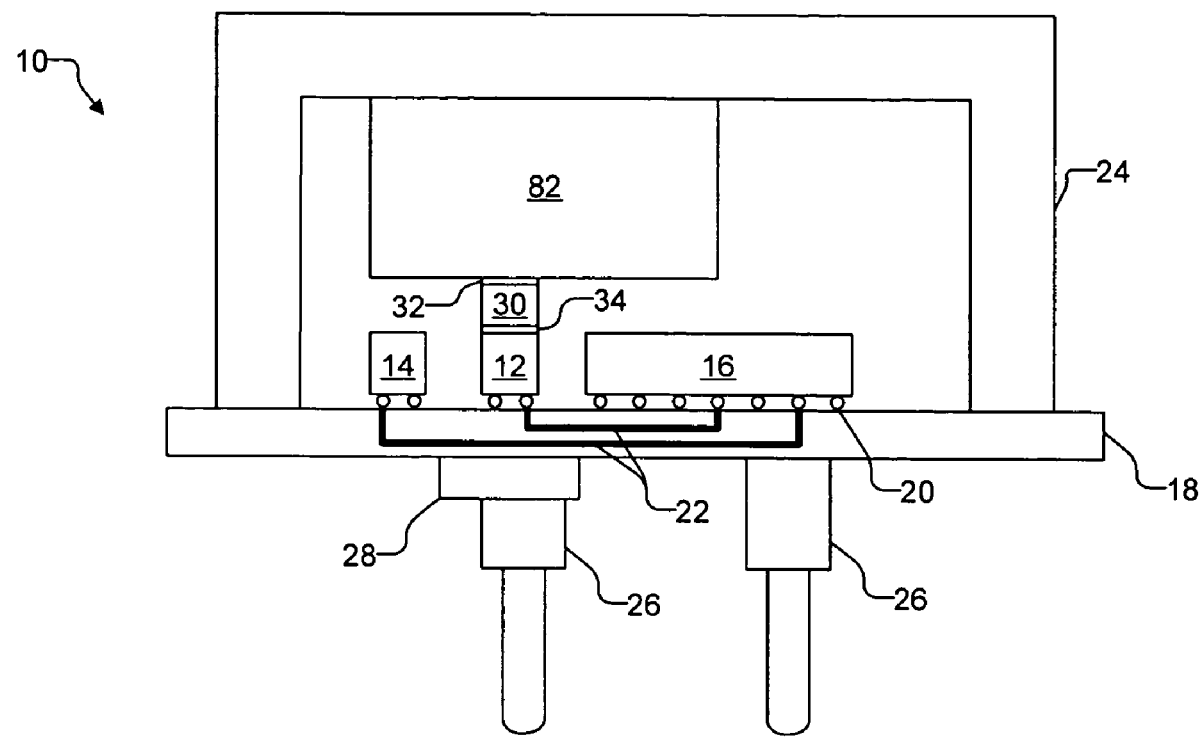
FIG. 7 illustrates a side view of a laser package where the temperature of a laser die is controlled independently from the other components in one embodiment of the invention.

FIG. 7 illustrates a side view of a laser package where the temperature of a laser die is controlled independently from the other components in one embodiment of the invention. In this embodiment, the solder ball joints used to flip chip mount dies 12, 14, and 16 are also used to thermally isolate laser die 12 away from the other components. A thermal electric cooler 82 is rigidly mounted to the inner surface of lid 24. In one embodiment, lid 24 includes a metal feed through (e.g., like a PCB via) to power thermal electric cooler 82. Metal pad 32 is formed on the bottom surface of thermal electric cooler 82. Soft metal 30 is disposed between laser die 12 and thermal electric cooler 82 to provide a conductive path. Soft metal 30 allows thermal electric cooler 82 to be rigidly mounted to lid 24, thereby allowing good heat conduction while permitting relative movement between the components along this conductive path. Thermal electric cooler 82 cools laser die 12 without affecting dies 14 and 16. In this embodiment, lid 24 can be metal or ceramic, such as aluminum nitride.

Various other adaptations and combinations of features of the embodiments disclosed are within the scope of the invention. Numerous embodiments are encompassed by the following claims.

What is claimed is:

1. A laser package, comprising:
   a submount:
   a laser die and a laser driver die mounted on a first surface of the submount;
   a lid mounted on the first surface of the submount over the laser die and the laser driver die;
   a first soft metal disposed between the laser die and the lid, the first soft metal conducting heat between the laser die and the lid;
   a second soft metal disposed between the laser driver die and the lid, the second soft metal conducting heat between the laser driver die and the lid, wherein the first and the second soft metals cold flow faster than the laser die and the lid can thermally cycle.

2. The package of claim 1, wherein the laser die comprises a first metal pad and the lid comprises a second metal pad on an inner surface, the first soft metal being disposed between the first and the second metal pads.

3. The package of claim 1, wherein the first and the second soft metals are selected from the group consisting of indium, gallium, mercury and tin/lead solder.

4. The package of claim 1, wherein the laser driver die comprises a first metal pad and the lid comprises a second metal pad on an inner surface, the second soft metal being disposed between the first and the second metal pads.

5. A laser package, comprising:
   a submount;
   a laser die and a photodetector die mounted on a surface of the submount;
   a lid mounted on the surface of the submount over the laser die and the photodetector die;
   a first soft metal disposed between the laser die and the lid, the first soft metal conducting heat between the laser die and the lid;
   a second soft metal disposed between the photodetector die and the lid, the second soft metal conducting heat between the photodetector die and the lid, wherein the first and the second soft metals cold flow faster than the laser die and the lid can thermally cycle.

6. The package of claim 5, wherein the photodetector die comprises a first metal pad and the lid comprises a second metal pad on an inner surface, the second soft metal being disposed between the first and the second metal pads.

7. The package of claim 1, further comprising a lens mounted on a second surface of the submount and opposite of the laser die.

8. The package of claim 1, farther comprising alignment pins mounted on a second surface of the submount.

9. A laser package, comprising:
   a submount,
   a laser die mounted on a surface of the submount;
   a lid mounted on the surface of the submount over the laser die,
   a thermal electric cooler mounted on an inner surface of the lid;

a soft metal disposed between the laser die and the thermal electric cooler, wherein the soft metal conducts heat between the laser die and the thermal electric cooler, the thermal electric cooler conducts heat between the soft metal and the lid, and the soft metal cold flows faster than the laser die and the lid can thermally cycle.

10. A method for forming a laser package, comprising:
mounting a laser die and a laser driver die on a first surface of a submount;
placing first and second soft metals on a lid; and
mounting the lid on the first surface of the submount, wherein the first soft metal is disposed between the laser die and the lid, the second, soft metal is disposed between the laser driver die and the lid, and the first and the second soft metals cold flow faster than the laser die and the lid can thermally cycle.

11. The method of claim 10, wherein the first and the second soft metals are selected from the group consisting of indium, gallium, mercury and tin/lead solder.

12. The method of claim 10, wherein the laser die comprises a first metal pad, the method further comprising forming a second metal pad on the lid, wherein the first soft metal is disposed between the first and the second metal pads.

13. The method of claim 10, wherein the laser driver die comprises a first metal pad, the method further comprising forming a second metal pad on the lid, wherein the second soft metal is disposed between the first and the second metal pads.

14. A method for forming a laser package, comprising:
mounting a laser die and a photodetector die on a surface of a submount;
placing first and second soft metals on the a lid; and
mounting the lid on the surface of the submount, wherein the first soft metal is disposed between the laser die and the lid, the second soft metal is disposed between the photodetector die and the lid, and the first and the second soft metals cold flow faster than the laser die and the lid can thermally cycle,.

15. The method of claim 14, wherein the photodetector die comprises a first metal pad, the method further comprising funning a second metal pad on the lid, wherein the second soft metal is disposed between the first and the second metal pads.

16. The method of claim 10, further comprising mounting a lens on a second surface of the submount and opposite of the laser die.

17. The method of claim 10, further comprising mounting alignment pins on a second surface of the submount.

18. A method for forming a laser package, comprising:
mounting a laser die on a surface of a submount;
mounting a thermal electric cooler on an inner surface of the lid;
placing a soft metal on the thermal electric cooler; and
mounting the lid on the surface of the submount, wherein the soft metal is disposed between the laser die and the thermal electric cooler, the thermal electric cooler is disposed between the soft metal and the lid, and the soft metal cold flows faster than the laser die and the lid can thermally cycle.

* * * * *

UNITED STATES PATENT AND TRADEMARK OFFICE
CERTIFICATE OF CORRECTION

PATENT NO. : 7,190,706 B2
APPLICATION NO. : 10/732994
DATED : March 13, 2007
INVENTOR(S) : Laurence McColloch It is certified that error appears in the above-identified patent and that said Letters Patent is hereby corrected as shown below:

(Column 4 Line 13) In Claim 1, delete "submount:" and insert -- submount; --, therefor.

(Column 4 Line 59) In Claim 8, delete "farther" and insert -- further --, therefor.

(Column 4 Line 62) In Claim 9, delete "submount," and insert -- submount; --, therefor.

(Column 5 Line 14) In Claim 10, delete "second," and insert -- second --, therefor.

(Column 6 Line 1) In Claim 14, before "a" delete "the".

(Column 6 Line 7) (Approx.) In Claim 14, delete "cycle,." and insert -- cycle. --, therefor.

(Column 6 Line 10) (Approx.) In Claim 15, delete "funning" and insert -- forming --, therefor.

Signed and Sealed this

Second Day of December, 2008

JON W. DUDAS
*Director of the United States Patent and Trademark Office*